US005504371A

United States Patent [19]

Niimi et al.

[11] Patent Number: 5,504,371

[45] Date of Patent: Apr. 2, 1996

[54] SEMICONDUCTOR CERAMIC DEVICE HAVING A CERAMIC ELEMENT WITH NEGATIVE TEMPERATURE COEFFICIENT OF RESISTANCE

[75] Inventors: Hideaki Niimi; Kenjiro Mihara; Yuichi Takaoka, all of Kyoto, Japan

[73] Assignee: Murata Manufacturing Co., Ltd., Japan

[21] Appl. No.: 276,514

[22] Filed: Jul. 15, 1994

[30] Foreign Application Priority Data

Jul. 19, 1993 [JP] Japan .................................... 5-177813

[51] Int. Cl.[6] .............................. H01L 23/48; H01C 7/10

[52] U.S. Cl. .......................... 257/703; 257/704; 257/705; 257/712; 257/745

[58] Field of Search .................................... 257/703, 704, 257/705, 236, 237, 741, 743, 745, 710, 712, 711, 747, 744; 338/22 R

[56] References Cited

U.S. PATENT DOCUMENTS

| | | | |
|---|---|---|---|
| 3,996,447 | 12/1976 | Boufford et al. | 257/712 |
| 4,816,800 | 3/1989 | Onaga et al. | 338/34 |
| 4,847,675 | 7/1989 | Eng | 257/745 |
| 4,908,685 | 3/1990 | Shihasaki et al. | 257/766 |
| 4,952,902 | 8/1990 | Kawaguchi et al. | 338/22 R |
| 5,006,505 | 4/1991 | Skertie | 257/712 |
| 5,019,891 | 5/1991 | Onuki et al. | 257/763 |
| 5,142,266 | 8/1992 | Friese et al. | 338/22 R |
| 5,256,901 | 10/1993 | Ohashi et al. | 257/710 |
| 5,294,750 | 3/1994 | Sakai et al. | 257/712 |
| 5,315,153 | 5/1994 | Nagai et al. | 257/701 |
| 5,343,076 | 8/1994 | Katayama et al. | 257/704 |

FOREIGN PATENT DOCUMENTS 48-6352 2/1973 Japan .

OTHER PUBLICATIONS

Bhide, et al., *Physical Review B*, "Mossbauer Studies of the High–Spin–Low–Spin Equilibria and the Localized–Collective Electron Transition in $LaCoO_3$", vol. 6, No. 3, Aug. 1, 1972.

*Primary Examiner*—Rolf Hille
*Assistant Examiner*—Alexander Oscar Williams
*Attorney, Agent, or Firm*—Ostrolenk, Faber, Gerb & Soffen

[57] ABSTRACT

A ceramic element is formed by a rare earth and transition element oxide such as $LaCoO_3$. The ceramic element is substantially isolated from the atmosphere by a case base, a case, etc.

9 Claims, 1 Drawing Sheet

SEMICONDUCTOR CERAMIC DEVICE HAVING A CERAMIC ELEMENT WITH NEGATIVE TEMPERATURE COEFFICIENT OF RESISTANCE

BACKGROUND OF THE INVENTION

1. Field of Invention

The invention relates to a semiconductor ceramic device using a ceramic element which has a negative temperature coefficient of resistance.

2. Description of the Related Art

In a switching power source, for example, an overcurrent flows at the moment a switch is turned on. As a device for absorbing such an initial inrush current, a so-called NTC thermistor device is used. An NTC thermistor device has a high resistance at room temperature, and is characterized in that the resistance decreases as the temperature rises. This high resistance can suppress the level of an initial inrush current, and, when the temperature of the device is then raised by heat generated by the device itself, the resistance decreases so that the power consumption is reduced in a steady state. Conventionally, a spinel oxide is used as a ceramic element of such an NTC thermistor.

When such an NTC thermistor device is used to prevent an inrush current from flowing, the NTC thermistor device must have a low resistance in an elevated temperature state which is caused by the heat generated by the device itself. However, a conventional NTC device using a spinel oxide generally has a tendency that the B-value is small as the specific resistance is made low. Consequently, such a conventional NTC device has a problem in that the resistance cannot be decreased in an elevated temperature state to a sufficiently low level, thereby disabling the power consumption in a steady state to be reduced.

In Japanese Patent Publication (Kokoku) No. SHO 48-6352, etc., ceramics having a composition in which 20 mol% of $Li_2O_3$ is added to $BaTiO_3$ is proposed as an NTC thermistor device having a large B-value. However, this NTC thermistor device has a high specific resistance of $10^5$ Ω·cm or higher at 140° C., and hence there arises a problem in that the power consumption in a steady state is increased.

In contrast, a device using $VO_2$ ceramics has resistance-sudden change characteristics in which the specific resistance is suddenly changed from 10 Ω·cm to 0.01 Ω·cm at 80° C. Therefore, the device is excellent for use of preventing an inrush current from flowing. However the $VO_2$ ceramic device has problems in that it is unstable, and that it must be rapidly cooled after a reducing firing process resulting in that its shape is restricted to a bead-like one. Since the allowable current of the device is as low as several tens of milliamperes, there arises a problem in that the device cannot be used in an apparatus such as a switching power source where a large current flows.

SUMMARY OF THE INVENTION

It is an object of the invention to provide a semiconductor ceramic device which can solve these problems of the prior art, in which the resistance in an elevated temperature state is lowered so that the power consumption is reduced, and which is excellent in reliability.

In order to attain the object, the inventors have eagerly studied ceramic compositions which have a low resistance, and which have negative temperature/resistance characteristics having a large B-value, and found that oxide ceramic compositions containing a rare earth element and a transition element have such characteristics. Furthermore, the inventors have found that a configuration in which such a rare earth and transition element oxide ceramic is used as a ceramic element and substantially isolated from the atmosphere can provide a semiconductor ceramic device which will not be destroyed by a large current, and in which the power consumption in a steady state can be reduced to a sufficiently low level, thereby accomplishing the invention.

The semiconductor ceramic device of the invention is characterized in that the ceramic element is formed by a rare earth and transition element oxide, and the ceramic element is substantially isolated from the atmosphere.

Rare earth and transition element oxides useful in the invention are not particularly restricted as far as they are oxides containing a rare earth element and a transition element. Specific examples of such useful oxides are LaCo or $NdCoO_3$ rare earth and transition element oxides. Particularly, an LaCo oxide has a B-value which is largely increased as the temperature rises, and which is small at room temperature. Therefore, a device using the LaCo oxide can attain excellent characteristics.

The characteristics that rare earth and transition element oxides have a low resistance and a B-value which is small at room temperature and large at a high temperature is reported by V. G. Bhide and D. S. Rajoria (Phys. Rev. B6[3]1021(1972)), etc. The inventors conducted various practical tests to confirm whether or not such characteristics can be applied to actual devices. As a result, it was found that a rare earth and transition element oxide is not destroyed by a large current and the power consumption in a steady state is reduced, but such an oxide has a tendency that the resistance changes when the oxide is allowed to stand in the atmosphere at a high temperature. When the oxide is in its original state, therefore, it cannot be put to practical use. According to the invention, a ceramic element made of such a rare earth and transition element oxide is configured so as to be substantially isolated from the atmosphere, thereby stabilizing the resistance of the element.

The above and other objects and features of the present invention will be more apparent from the following description taken in conjunction with the accompanying drawings.

DETAILED DESCRIPTION OF THE PREFERRED EMBODIMENTS

Hereinafter, the invention will be described in detail by illustrating its embodiments.

First, powder of $Co_2O_3$ and that of $La_2O_3$ were weighed so as to constitute the composition of $LaCoO_3$. The weighed powder, purified water, and zirconia balls were subjected to a wet blending in a polyethylene pot for 7 hours. Thereafter, the mixture was dried, and then calcinated at 1,000° C. for 2 hours, to produce calcinated powder. The calcinated powder was combined with a binder and water, and these materials were subjected to a wet blending in a polyethylene pot for 5 hours. The mixture was dried, and then formed into a disk-like compact by a dry press.

Next, the compact was calcined at 1,350° C. in the atmosphere, to obtain a calcined ceramic element made of a rare earth and transition element oxide. Then, Ag paste was applied to both principal faces of the ceramic element, and baked to form electrodes.

As a comparison, a conventional NTC thermistor device was produced which is made of a ceramic element formed by weighing in wt.% $Co_3O_4$, $Mn_3O_4$, and $CuCO_3$ in the ratio of 6:3:1.

The NTC thermistor device of the embodiment, and that of the prior art were placed in a switching power source, and effects of suppressing an inrush current were measured. Currents respectively obtained at elapsed times of 1 sec., 2 sec. 5 sec., and 30 sec. after a switch was turned on are listed in Table 1 below.

TABLE 1

| Elapsed times after switch was turned on (sec.) | Embodiment (LaCo) (A) | Prior art device (A) |
|---|---|---|
| 1 | 0.8 | 0.8 |
| 2 | 1.5 | 1.3 |
| 5 | 1.9 | 1.6 |
| 30 | 2.2 | 1.8 |

As seen from Table 1, the NTC thermistor device using the rare earth and transition element oxide in accordance with the invention has a low resistance in a normal state, thereby allowing a large current to pass therethrough.

Next, embodiments having a configuration in which a ceramic device of the LaCo oxide is hermetically sealed in a case or by resin so as to be isolated from the atmosphere will be described.

EMBODIMENT 1

Figure 1:
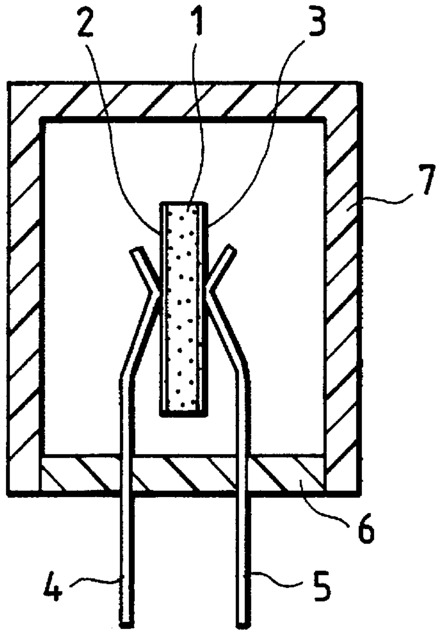
FIG. 1 is a cross-sectional view showing a semiconductor ceramic device in accordance with an embodiment of the invention.

The foregoing LaCo oxide ceramic device was placed in a PPS resin case. FIG. 1 shows the semiconductor ceramic device. Electrodes 2 and 3 are formed on both sides of the ceramic element 1 by baking Ag paste thereon, respectively. Plate spring terminals 4 and 5 are mounted so as to be electrically connected with the electrodes 2 and 3, respectively. The terminals 4 and 5 pass through a case base 6. The space over the case base 6 is covered by a case 7. The case base 6 and the case 7 are made of PPS resin. In the embodiment, the ceramic element 1 is isolated from the atmosphere by covering it with the case base 6 and the case 7.

EMBODIMENT 2

Figure 2:
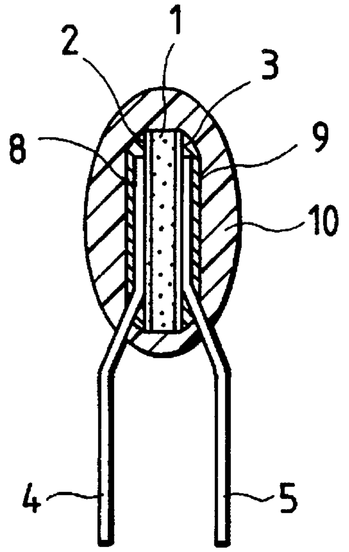
FIG. 2 is a cross-sectional view showing a semiconductor ceramic device in accordance with another embodiment of the invention.

The foregoing LaCo oxide ceramic device was dipped into silicone resin to conduct a dip molding, thereby covering the device by the silicone resin. FIG. 2 shows the semiconductor ceramic device. The terminals 4 and 5 are mounted by solder joints 8 and 9 so as to be electrically connected with electrodes 2 and 3 formed on both sides of the ceramic element 1, respectively. In this state, the ceramic element is dipped into silicone resin to conduct a dip molding, whereby a resin molding portion 10 made of the silicone resin is formed around the ceramic element. In the embodiment, the ceramic element 1 is isolated from the atmosphere by the resin molding portion 10.

COMPARISON EXAMPLE 2

Figure 3:
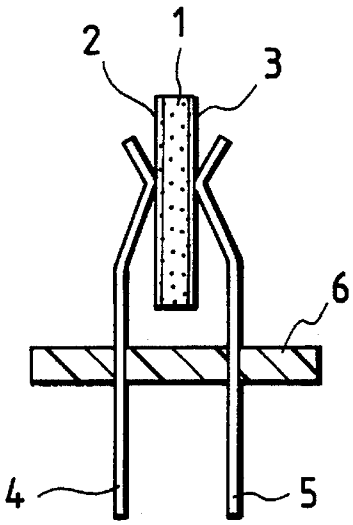
FIG. 3 is a cross-sectional view showing a ceramic device for a comparison.

As shown in FIG. 3, a ceramic device having a configuration in which the ceramic element is not covered by the case 7 shown in FIG. 1 was produced as a comparison.

COMPARISON EXAMPLE 2

Figure 4:
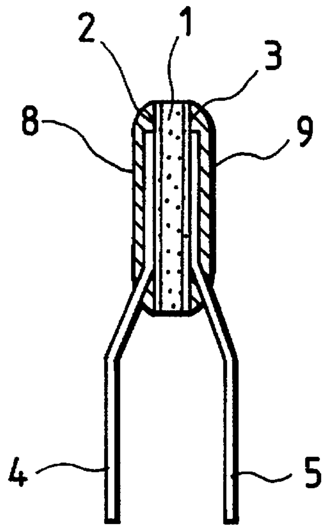
FIG. 4 a cross-sectional view showing another ceramic device for a comparison.

As shown in FIG. 4, a ceramic device having a configuration in which the ceramic element is not covered by the resin molding portion 10 shown in FIG. 2 was produced as a comparison.

The devices of Embodiments 1 and 2, and Comparison examples 1 and 2 were allowed to stand in the atmosphere at 180 ° C., and the changes of the resistances at room temperature were measured. The results are listed in Table 2 below.

TABLE 2

| | Embodiment 1 (Ω) | Embodiment 2 (Ω) | Comparison Example 1 | Comparison Example 2 |
|---|---|---|---|---|
| 0 HR | 5.0 | 5.0 | 5.0 | 5.0 |
| 500 HR | 5.0 | 5.0 | 5.5 | 5.5 |
| 1000 HR | 5.2 | 5.3 | 6.2 | 6.8 |
| 5000 HR | 5.4 | 5.5 | 10.5 | 11.2 |

As seen from Table 2, in both the devices of Embodiments 1 and 2 configured so that their ceramic elements are isolated from the atmosphere in accordance with the invention, the changes of the resistances at room temperature are smaller than those of Comparison examples 1 and 2.

In the embodiments described above, in order to isolate the ceramic element from the atmosphere, the ceramic element is covered by resin such as PPS resin or silicone resin. The resin for constituting the case is not restricted to the above, and may be another heat resistant resin such as PET (polyethylene terephtalate), or PBT (polybuthylene terephtalate). The resin molding portion is restricted to the above, and may be another heat resistant resin such as silicone resin or epoxy resin.

According to the invention, a ceramic element is formed by a rare earth and transition element oxide, and substantially isolated from the atmosphere. Since a ceramic element made of a rare earth and transition element oxide is used, the B-value is small at room temperature and large at a high temperature, whereby the power consumption in a steady state can be reduced to a sufficiently low level, and a large current is allowed to pass through the ceramic device. Since the ceramic element is isolated from the atmosphere, the change of the resistance at room temperature can be made small. Consequently, the semiconductor ceramic device of the invention can be used in an apparatus such as a switching power source where a large current flows.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor ceramic device, comprising:

a ceramic element having a resistance value at a specified temperature and a negative temperature coefficient of resistance, said ceramic element being formed of a rare earth and transition element oxide; and a cover for said ceramic element so that said ceramic element is substantially isolated from the atmosphere, said cover for said ceramic element isolating the ceramic element from the atmosphere and preventing a substantial change in the resistance value even when the ceramic element is heated to high operating temperatures by electrical current passing therethrough.

2. A semiconductor ceramic device according to claim 1, wherein said rare earth and transition element oxide is made of LaCo oxide.

3. A semiconductor ceramic device according to claim 1, wherein said rare earth and transition element oxide is made of $NdCoO_3$.

4. A semiconductor ceramic device according to claim 1, wherein said cover comprises a case.

5. A semiconductor ceramic device according to claim 4, wherein said case is made of heat resistant resin.

6. A semiconductor ceramic device according to claim 5, wherein said case is made of one of PPS resin, PET resin and PBT resin.

7. A semiconductor ceramic device according to claim 1, wherein said cover comprises a resin molding portion formed around said ceramic element.

8. A semiconductor ceramic device according to claim 7, wherein said resin molding portion is made of heat resistant resin.

9. A semiconductor ceramic device according to claim 8, wherein said resin molding portion is made of one of silicone resin and epoxy resin.

* * * * *